(12) United States Patent
Yoshida et al.

(10) Patent No.: US 11,498,215 B2
(45) Date of Patent: Nov. 15, 2022

(54) ROBOT ARM APPARATUS

(71) Applicant: Samsung Display Co., Ltd., Yongin-si (KR)

(72) Inventors: Futoshi Yoshida, Suwon-si (KR); Jeongho Yi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 475 days.

(21) Appl. No.: 16/543,333

(22) Filed: Aug. 16, 2019

(65) Prior Publication Data

US 2020/0189109 A1 Jun. 18, 2020

(30) Foreign Application Priority Data

Dec. 18, 2018 (KR) .................. 10-2018-0163865

(51) Int. Cl.
*B25J 9/16* (2006.01)
*H05K 3/30* (2006.01)
*H05K 5/00* (2006.01)

(52) U.S. Cl.
CPC .............. *B25J 9/1687* (2013.01); *H05K 3/30* (2013.01); *H05K 5/0017* (2013.01)

(58) Field of Classification Search
CPC ......... B25J 9/1687; G05B 2219/40031; G05B 2219/40032; H05K 1/142; H05K 2203/082; H05K 2203/1509
See application file for complete search history.

(56) References Cited

U.S. PATENT DOCUMENTS

| 4,132,318 A * | 1/1979 | Wang ................. B25J 13/082 |
| | | 294/86.4 |
| 4,723,353 A * | 2/1988 | Monforte ............ B25J 15/0052 |
| | | 414/737 |
| 8,925,944 B2 | 1/2015 | Byrnes |
| 10,694,647 B2 * | 6/2020 | Yokoyama ........... H05K 13/041 |
| 2020/0189109 A1* | 6/2020 | Yoshida ................ B25J 9/1687 |

FOREIGN PATENT DOCUMENTS

| JP | 2000-135636 A | 5/2000 |
| JP | 2009-39814 A | 2/2009 |
| KR | 10-1267388 B1 | 5/2013 |
| KR | 10-1620932 B1 | 5/2016 |

\* cited by examiner

*Primary Examiner* — Minh N Trinh
(74) *Attorney, Agent, or Firm* — Lewis Roca Rothgerber Christie LLP

(57) ABSTRACT

Embodiments of the present disclosure provide a robot arm apparatus including a fastener for fastening a first electronic component to a second electronic component, and a movable part configured to move the fastener. The fastener includes an arm connected to the movable part, a head connected to the arm and configured to contact the first electronic component, and a lock configured to be in contact with the arm when the first electronic component is moved to a reference space, and to be spaced apart from the arm when the first electronic component is fastened to the second electronic component after the first electronic component is moved to the reference space.

10 Claims, 14 Drawing Sheets

ROBOT ARM APPARATUS

CROSS-REFERENCE TO RELATED APPLICATION

This application claims priority to and the benefit of Korean Patent Application No. 10-2018-0163865, filed on Dec. 18, 2018, the entire content of which is hereby incorporated by reference.

BACKGROUND

The present disclosure herein relates to a robot arm apparatus, a component fastening system including the same, and a component fastening method using a robot arm apparatus, and more particularly, to a robot arm apparatus applicable to fasten circuit boards of a display device, a component fastening system including the same, and a component fastening method using the robot arm apparatus.

Display devices may be applied to various fields, such as for use as display devices for mobile devices, such as smartphones, digital cameras, camcorders, portable terminals, laptop computers, or tablet personal computers, and for use as display devices for electronic products, such as televisions. Display devices provide users with clear visual information in a format familiar to the user, and thus most electronic devices include display devices. The demand for electronic devices has exploded in modern society and accordingly, a fast production speed is desirable for display devices.

Thus, processes for manufacturing display devices may be automated by using robots and/or the like. In an assembly process of a display device, a robot arm apparatus and a component fastening device including the same may fasten the components of the display device in place of workers. Thus, the robot arm apparatuses have been spotlighted in terms of the cost and speed of the manufacturing process.

SUMMARY

The present disclosure provides a robot arm apparatus capable of fastening electronic components such as a circuit board of a display device without intervention by an operator, a component fastening system including the same, and a method for fastening components using the robot arm apparatus.

The present disclosure provides a robot arm apparatus which improves the accuracy of fastening an electronic component and reduces damage to the electronic component in a fastening process, a component fastening system including the same, and a method for fastening components using the robot arm apparatus.

An embodiment of the present invention provides a robot arm including: a fastener configured to fasten a first electronic component to a second electronic component; and a movable part configured to move the fastener. The fastener includes an arm, a head, and a lock. The arm is connected to the movable part. The head is connected to the arm and contacts the first electronic component. The lock contacts the arm when the first electronic component is moved to a reference space, and is spaced apart from the arm when the first electronic component is fastened to a second electronic component after the first electronic component is moved to the reference space.

In an embodiment, the arm may include: a first link connected to the movable part; a joint connected to the first link and configured to be rotatable; and a second link connected between the joint and the head. In an embodiment, the lock may contact the first link and the second link so that the arm may be fixed when the first electronic component is moved to the reference space, and the lock may be spaced apart from the first link and the second link when the first electronic component is fastened to the second electronic component.

In an embodiment, the lock may include: a fixing part having a contact surface to contact the arm when the first electronic component is moved to the reference space; and an actuator configured to move the fixing part so that the fixing part contacts the arm when the first electronic component is moved to the reference space, and to move the fixing part so that the fixing part is spaced apart from the arm when the first electronic component is fastened to the second electronic component.

In an embodiment, the lock may include: a first fixing part configured to contact a first surface of the arm when the first electronic component is moved to the reference space; and a second fixing part configured to contact a second surface of the arm when the first electronic component is moved to the reference space, the second surface facing the first surface. In an embodiment, a direction in which the first electronic component is fastened to the second electronic component may be perpendicular to a direction in which the first and second fixing parts contacts the arm when the first electronic component is moved to the reference space.

In an embodiment, the lock may include: a third fixing part configured to contact a third surface of the arm when the first electronic component is moved to the reference space; and a fourth fixing part configured to contact a fourth surface of the arm when the first electronic component is moved to the reference space. The first surface and the second surface may face each other in a first direction, and the third surface and the fourth surface may face each other in a second direction crossing the first direction.

In an embodiment, the arm may include: a first link connected to the movable part; a flexible member connected to the first link; and a second link connected to the flexible member and between the flexible member and the head, wherein the lock may contact the first link and the second link so that the arm is fixed when the first electronic component is moved to the reference space, and may be spaced apart from the first link and the second link when the first electronic component is fastened to the second electronic component. Alternatively, the arm may include an elastic material.

In an embodiment, the reference space may include a space in which at least a portion of a first fastening region of the first electronic component contacts at least a portion of a second fastening region of the second electronic component.

In an embodiment of the present invention, a component fastening system includes a robot arm, a position detection sensor, and a processor. The robot arm carries a first electronic component. The position detection sensor detects a position of the first electronic component. The processor controls the robot arm so that the robot arm operates in a movement mode or a fastening mode on the basis of the position of the first electronic component and a position of a second electronic component. The robot arm includes: a head configured to contact the first electronic component; an arm connected to the head; and a lock configured to contact the arm in the movement mode and be spaced apart from the arm in the fastening mode.

In an embodiment, the processor may control the robot arm so that the robot arm operates in the movement mode until the first and second electronic components contact each other, and operates in the fastening mode until the first and second electronic components are fastened after contacting each other.

In an embodiment of the present invention, a component fastening method using a robot arm includes: lifting a first electronic component; fixing an arm comprising a rotatable joint or an elastic material by utilizing a lock; moving the arm so that the first electronic component is moved to a reference space; releasing the arm fixed by the lock after the first electronic component is moved to the reference space; and fastening the first electronic component to the second electronic component.

BRIEF DESCRIPTION OF THE FIGURES

The accompanying drawings are included to provide a further understanding of the present invention, and are incorporated in and constitute a part of this specification. The drawings depict illustrative embodiments of the present invention and, together with the description, serve to explain principles of the present invention. In the drawings.

DETAILED DESCRIPTION

Figure 1:
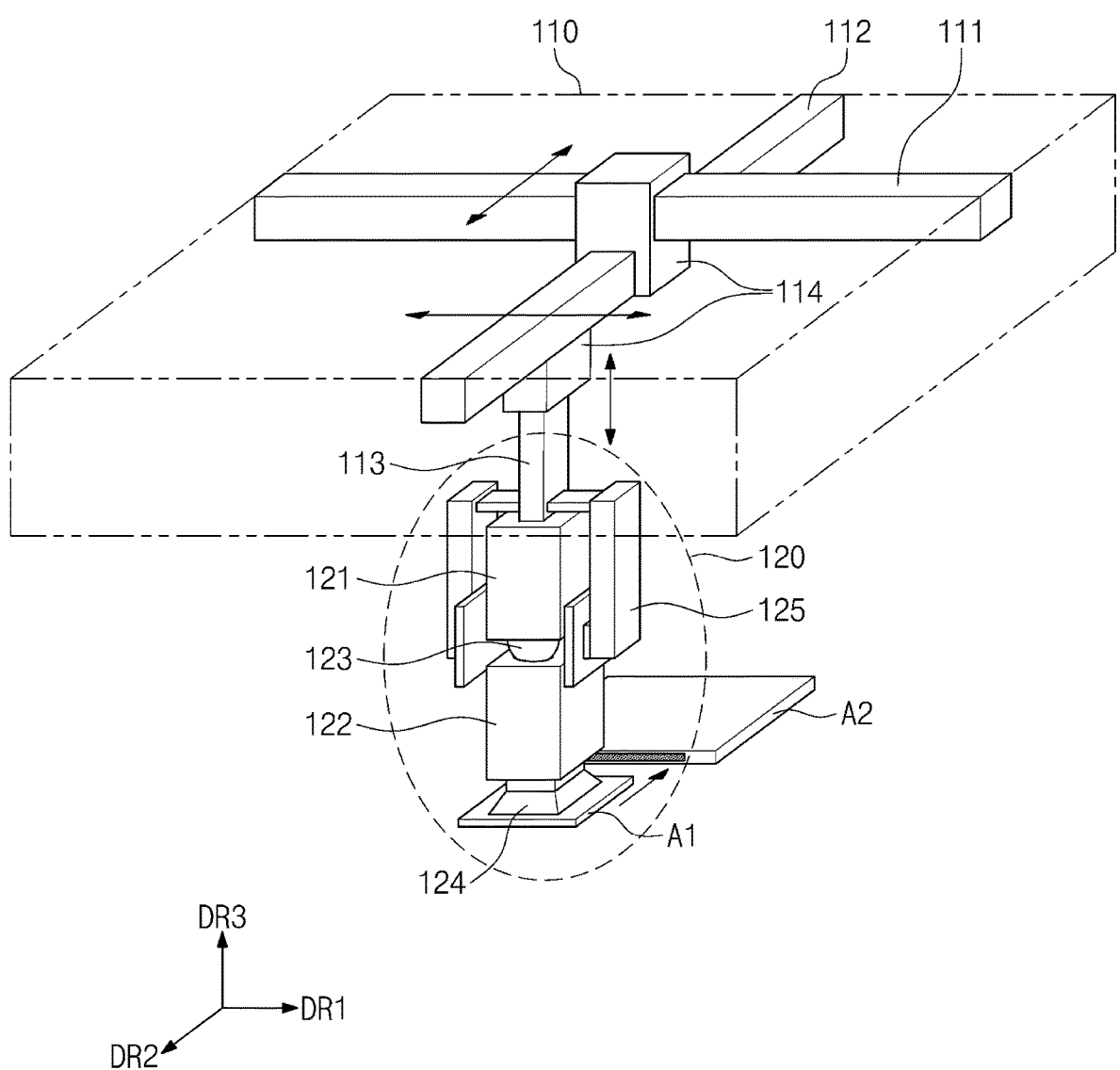
FIG. 1 is a perspective view of a robot arm apparatus (or a robot arm) according to an embodiment of the present invention.

Hereinafter, example embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described.

Like reference numerals refer to like elements throughout. It will be understood that although the terms "first" and "second" may be used herein to describe various elements, these elements should not be limited by these terms. The terms are only used to distinguish one element from other elements. For example, a first element may be referred to as a second element and the second element may similarly be referred to as the first element without departing from the scope of the present invention. The terms of a singular form may include plural forms unless obviously referred to the contrary in context.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a robot arm apparatus (or a robot arm or a robot arm device) 100 according to an embodiment of the present invention. Referring to FIG. 1, the robot arm apparatus 100 includes a movable part 110 and a fastening part (or fastener) 120. The robot arm apparatus 100 shown in FIG. 1 will be understood as an illustrative shape, and the shape of the robot arm apparatus 100 is not limited to that in FIG. 1. Each of the components of the robot arm apparatus can still be capable of performing functions to be described below in embodiments in which the robot arm apparatus 100 may have a different shape from that in FIG. 1.

For convenience of description, first to third directions DR1 to DR3 are defined in FIG. 1 and drawings illustrated hereinafter. The first to third directions DR1 to DR3 are perpendicular to each other. With reference to the first to third directions DR1 to DR3, a three-dimensional coordinate system is established, and according to the established three-dimensional coordinates, the movable part 110 may move the fastening part 120.

The robot arm apparatus 100 carries a first electronic component A1. The first electronic component A1 is fastened to a second electronic component A2. As an illustrative example, the first electronic component A1 may be moved in the second direction DR2 and fastened to the second electronic component A2, but the fastening direction is not limited thereto. For example, the fastening direction of the first electronic component A1 and the second electronic component A2 may be an oblique direction different from the first to third directions DR1 to DR3. As an illustrative example, it is illustrated that an insertion part of the first electronic component A1 is fastened to a recess part of the second electronic component A2, but embodiments of the present invention are not limited thereto.

The movable part 110 may be connected to the fastening part 120 and move the fastening part 120 to a specific coordinate. To this end, the movable part 110 may include a first frame 111, a second frame 112, a third frame 113, and movement actuators 114. For example, the first frame 111 may extend in the first direction DR1 and relate to the movement of the fastening part 120 in the first direction DR1. The second frame 112 may extend in the second direction DR2 and relate to the movement of the fastening part 120 in the second direction DR2. The third frame 113 may extend in the third direction DR3 and relate to the movement of the fastening part in the third direction DR3.

The movement actuators 114 may mechanically control the robot arm apparatus 100 so as to move the fastening part 120 to a specific coordinate. For example, the movement actuators 114 themselves may move, or the movement actuators 114 may move at least one of the first to third frames 111 to 113 to change the position of the fastening part 120.

The movable part 110 shown in FIG. 1 will be understood as an illustrative structure, and the movable part 110 may have various shapes which mechanically control the movement of the fastening part 120. For example, the movable parts 110 may include an arm. The arm may include a link connected to the fastening part 120, a joint for rotating the link, and a movement actuator for adjusting the length of the link or the connection position between the link and the fastening part 120. Alternatively, the arm may be implemented such that at least two links are rotated and moved through a joint. The movable part 110 may control the fastening part 120 using a cylindrical coordinate system or a spherical coordinate system as well as a Cartesian coordinate system.

The fastening part 120 is configured to carry the first electronic component A1. The fastening part 120 may include a first link 121, a second link 122, a joint 123, a head part (or a head) 124, and a lock part (or a lock) 125. The first link 121, the second link 122 and the joint 123 may form an arm of the fastening part 120.

One side of the first link 121 may be connected to the movable part 110 and may be, in some embodiments, connected to the third frame 113. The other side of the link 121 may be connected to the joint 123. The first link 121 may have a metal material (e.g., a rigid metal material). The first link 121 may not rotate. The positions of the movable part 110 and the joint 123 connected to the first link 121 may be different from those in FIG. 1.

The one side of the second link 122 may be connected to the joint 123 and the other side may be connected to the head part 124. The second link 122 may include a metal material (e.g., a rigid metal material). The second link may rotate around the joint 123. The positions of the head part 124 and the joint 123 connected to the second link 122 may be different from those in FIG. 1.

The joint 123 is disposed between the first link 121 and the second link 122. The joint 123 may include a curved surface having a curvature and may, in some embodiments, have a spherical shape. The joint 123 may be rotatable. The second link 122 may rotate around the spherical center of the joint 123.

The head part 124 may be connected to the second link 122 and be configured so as to maintain the connection state with the first electronic component A1 in order to carry the first electronic component A1. For example, the head part 124 may have a shape suitable for applying suction to the first electronic component A1. In this case, an opening may be formed inside the head part 124, and the first electronic component A1 may be lifted by a pneumatic pressure. However, embodiments of the present invention are not limited thereto, and the head part 124 may include a semi-adhesive member or have a shape for gripping or supporting the first electronic component A1.

The lock part 125 locks the arm so as to prevent or substantially prevent the arm from being moved by the joint 123 while the first electronic component A1 is moved to a reference space. This is because, in order that the first electronic component A1 accurately reaches the second electronic component A2, it is desirable for the movement of the fastening part 120 to be minimized. Here, the reference space includes a space in which at least a portion of an insertion part (i.e., fastening region) of the first electronic component A1 comes into contact with at least a portion of a recess part (i.e., fastening region) of the second electronic component A2. However, embodiments of the present invention are not limited thereto, and the reference space may include a space in which the distance between the first electronic component A1 and the second electronic component A2 satisfies a reference distance for performing precise movement for fastening. The movement of the first electronic component A1 to the reference space may be detected by a position detection sensor.

The lock part 125 releases the lock of the arm while the fastening of the first electronic component A1 and the second electronic component A2 is performed after the first electronic component A1 is moved to the reference space. If the fastening of the first and second electronic components A1 and A2 is performed while the fastening part 120 is fixed, the first electronic component A1 or the second electronic component A2 may be damaged. In such a situation, if the insertion part and the recess part are not completely aligned, a portion of the insertion part or the recess part may be damaged while the first electronic component A1 is inserted into the second electronic component. Damage to the first and second electronic components A1 and A2 may be reduced during an insertion process by releasing the fixation of the arm. In addition, flexibility or a degree of freedom may be secured in the insertion of the first electronic component A1.

The lock part 125 may be disposed on a side surface of the arm, for example, disposed adjacent to the first direction DR1 or second direction DR2 from the arm. In a movement mode in which the first electronic component A1 is moved to the reference space, the lock part 125 may be in contact with the arm, for example, the first and second links 121 and 122. In a fastening mode in which the first electronic component A1 and the second electronic component A2 are fastened, the lock part 125 may be spaced apart from the arm.

Figure 2:
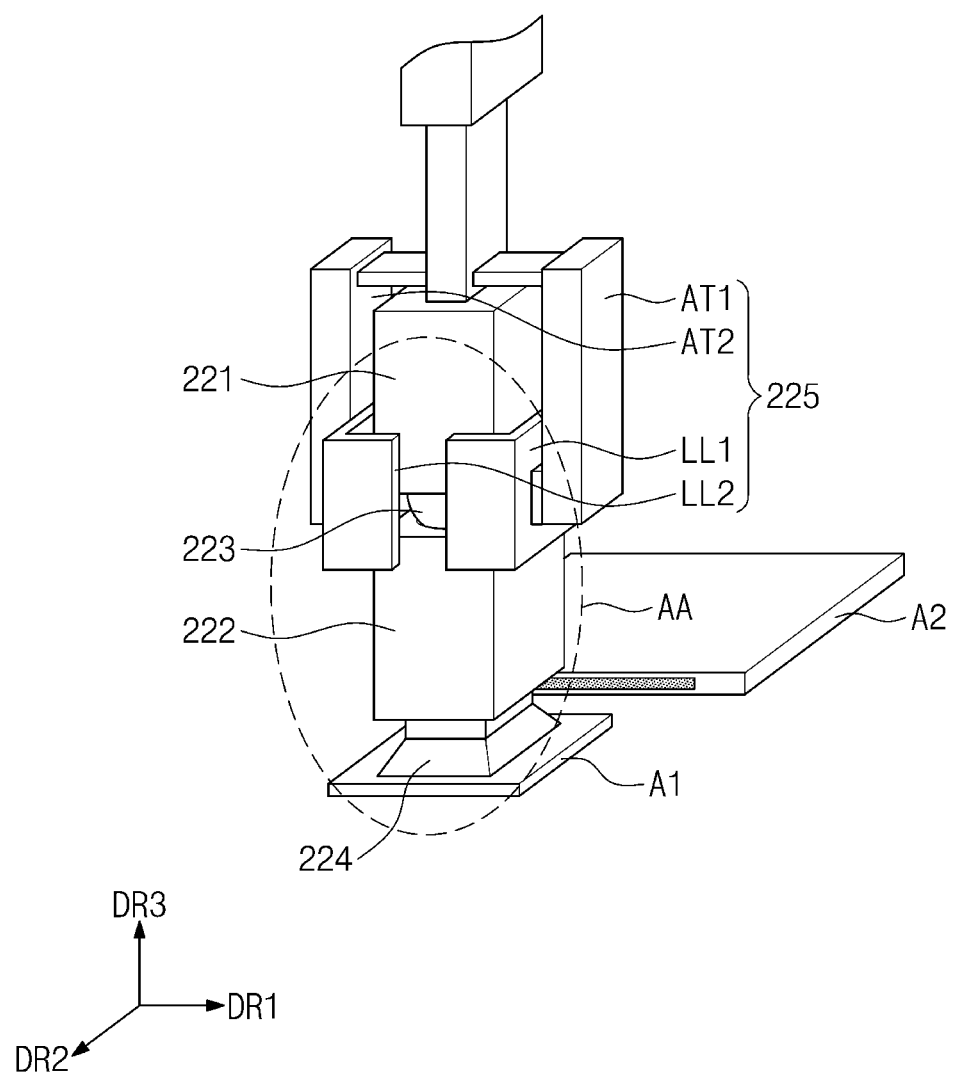
FIG. 2 is an illustrative perspective view of a fastening part (or a fastener) according to an embodiment of the present invention.

FIG. 2 is an illustrative perspective view of a fastening part 220 according to an embodiment of the present invention. Referring to FIG. 2, the fastening part 220 may include a first link 221, a second link 222, a joint 223, a head part 224, and a lock part 225. The first link 221, the second link 222, the joint 223, and the head part 224 correspond to first link 121, the second link 122, the joint 123, and the head part 124, respectively, and thus, a detailed description thereof will be omitted. The lock part 225 may include a first fixing part LL1, a second fixing part LL2, a first actuator AT1, and a second actuator AT2.

The first fixing part LL1 and the second fixing part LL2 are adjacent to each other in the first direction DR1 from the arm. As described above, the arm includes the first link 221, the second link 222, and the joint 223. In the movement mode, the first fixing part LL1 and the second fixing part LL2 are in contact with the first link 221 and the second link 222. The first fixing part LL1 is in contact with first surfaces of each of the first and second links 221 and 222. The second fixing part LL2 is in contact with second surfaces of each of the first and second links 221 and 222. The first surfaces may face second surfaces with respect to the first direction DR1. In the fastening mode, the first fixing part LL1 and the second fixing part LL2 are spaced apart from the arm.

A first actuator AT1 mechanically controls the position of the first fixing part LL1. A second actuator AT2 mechanically controls the position of the second fixing part LL2. In the movement mode, the first and second actuators AT1 and AT2 move the first and second fixing parts LL1 and LL2 so that the first and second fixing parts LL1 and LL2 contact the arm. In the fastening mode, the first and second actuators AT1 and AT2 move the first and second fixing parts LL1 and LL2 so that the first and second fixing parts LL1 and LL2 are spaced apart from the arm.

The first and second actuators AT1 and AT2 may mechanically control the first and second fixing parts LL1 and LL2 through various methods. For example, the first and second actuators AT1 and AT2 may include a cylinder or a piston, and may mechanically control the first and second fixing parts LL1 and LL2 using a pneumatic actuator, a hydraulic actuator, an electric motor, or the like. For example, the first and second actuators AT1 and AT2 may control the first and second fixing parts LL1 and LL2 by using torque from a locking lever. As an illustrative example, the first and second actuators AT1 and AT2 may control the first and second fixing parts LL1 and LL2 by pushing or pulling the first and second fixing parts LL1 and LL2 like a press.

The first electronic component A1 may be inserted in the second electronic component A2 in a direction perpendicular to the first direction DR1. For example, the first electronic component A1 may be inserted in the second electronic component A2 in the second direction DR2. Because the lock part 225 fixes the arm in the first direction DR1, the first electronic component A1 may be firmly fixed in the first direction DR1 and/or the third direction DR3. Even when the arm moves in the second direction DR2, the damage to the first and second electronic components A1 and A2 may be reduced compared to those in the other directions.

As an illustrative example, the first electronic component A1 may be a first circuit board connected to a display panel. When a board having a smaller thickness such as the first circuit board is inserted in a direction perpendicular to the first direction DR1, the misalignment of the first circuit board may be reduced. However, embodiments of the present invention are not limited thereto, and the first electronic component A1 may be a stiff printed circuit board.

Figure 3A:
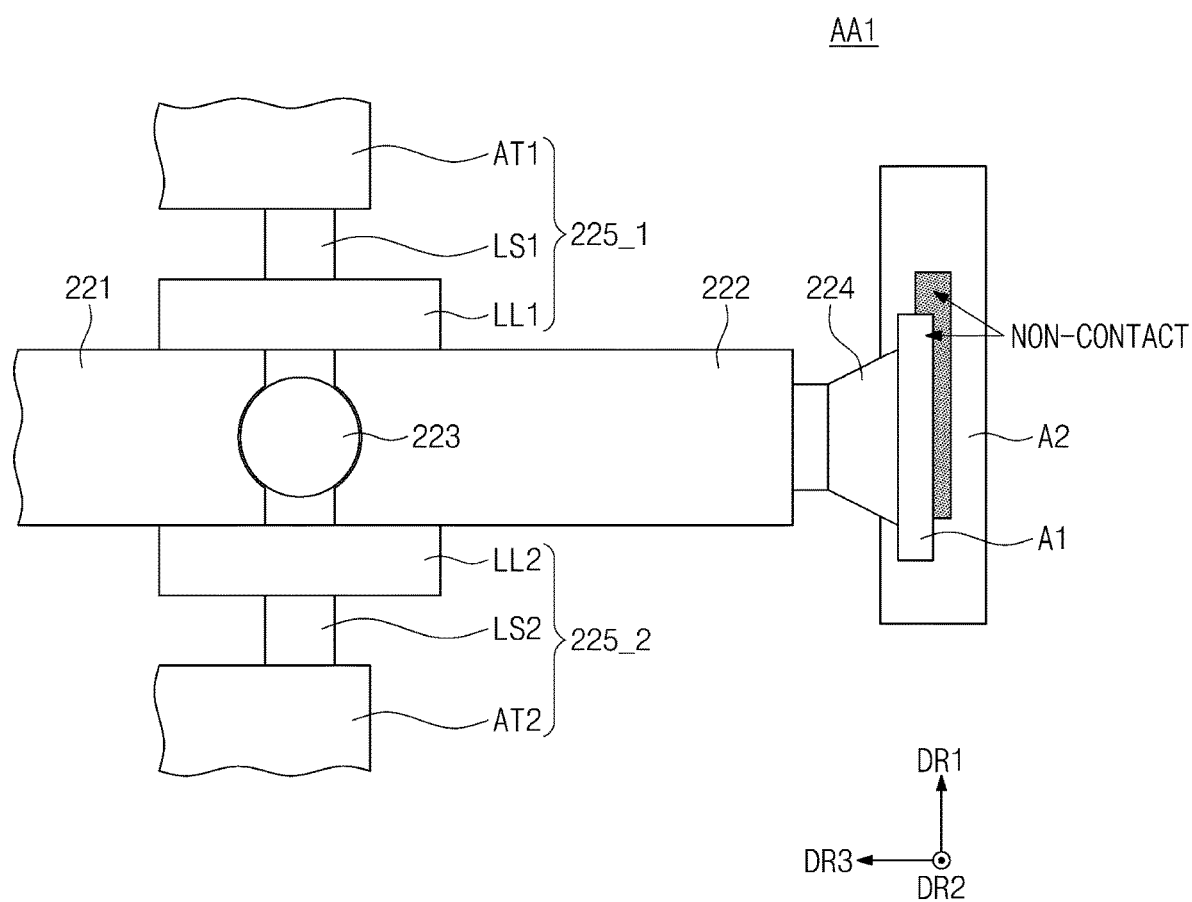
FIGS. 3A and 3B are illustrative perspective views of region AA of FIG. 2 in a movement mode.
Figure 3B:
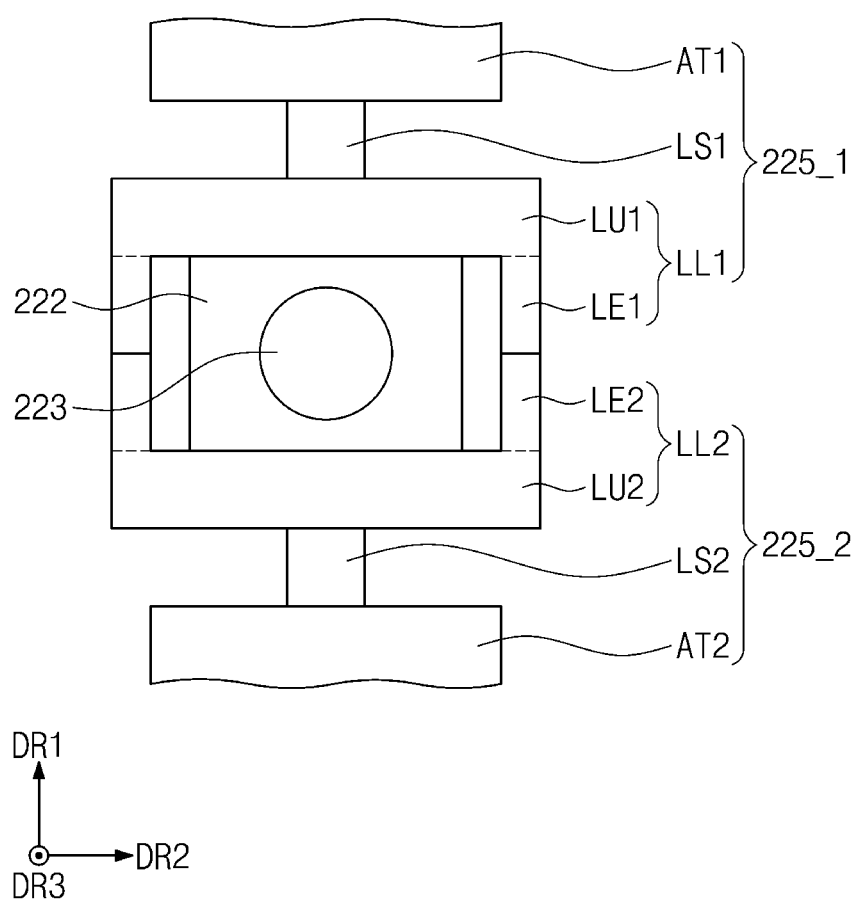

FIGS. 3A and 3B are illustrative perspective views of region AA of FIG. 2 in the movement mode. FIG. 3A is a cross-sectional view of the region AA when viewed in the second direction DR2 with respect to a plane defined by the first direction DR1 and the third direction DR3. FIG. 3B is a cross-sectional view of the region AA when viewed in the third direction DR3 with respect to a plane defined by the first direction DR1 and the second direction DR2. For convenience of description, FIG. 3A defines a first region AA1, and FIG. 3B defines a second region AA2.

Referring to the first region AA1, the fastening part 220 may include the first link 221, the second link 222, the joint 223, the head part 224, a first lock part 225_1, and a second lock part 225_2. The first lock part 225_1 and the second lock part 225_2 are included in the lock part 225 of FIG. 2. In the movement mode, a first electronic component A1 attached to the head part 224 may not contact a second electronic component A2. In the movement mode, the first and second lock parts 225_1 and 225_2 fix the first and second links 221 and 222. Because the movement of the first electronic component A1 is inhibited, the position of the first electronic component A1 may be accurately controlled.

The first lock part 225_1 may include the first actuator AT1, the first fixing part LL1, and a first support part LS1. The second lock part 225_2 may include the second actuator AT2, the second fixing part LL2, and a second support part LS2. In the movement mode, the first and second actuators AT1 and AT2 bring the first and second fixing parts LL1 and LL2 into contact with the first link 221 and the second link 222 in the first direction DR1. The first support part LS1 is disposed between the first actuator AT1 and the first fixing part LL1 and transmits a force generated by the first actuator AT1 to the first fixing part LL1. The second support part LS2 is disposed between the second actuator AT2 and the second fixing part LL2 and transmits a force generated by the second actuator AT2 to the second fixing part LL2.

Referring to the second region AA2, the fastening part 220 may include the second link 222 (and may also include the first link 221), the joint 223, the first lock part 225_1, and the second lock part 225_2. The first lock part 225_1 may include the first actuator AT1, the first fixing part LL1, and the first support part LS1. The second lock part 225_2 may include the second actuator AT2, the second fixing part LL2, and the second support part LS2.

The first fixing part LL1 may include a first contact part LU1 contacting the first and second links 221 and 222 in the movement mode, and first extension parts LE1 which extend in the first direction DR1 from the first contact part LU1. The second fixing part LL2 may include a second contact part LU2 contacting the first and second links 221 and 222 in the movement mode, and second extension parts LE2 which extend in the first direction DR1 from the second contact part LU1. The first and second extension parts LE1 and LE2 may be spaced apart from the first and second links 221 and 222 in the second direction. The first and second extension parts LE1 and LE2 may be in contact with each other in the movement mode so that the first and second links 221 and 222 are not deformed by being applied with an excessive force.

Figure 4A:
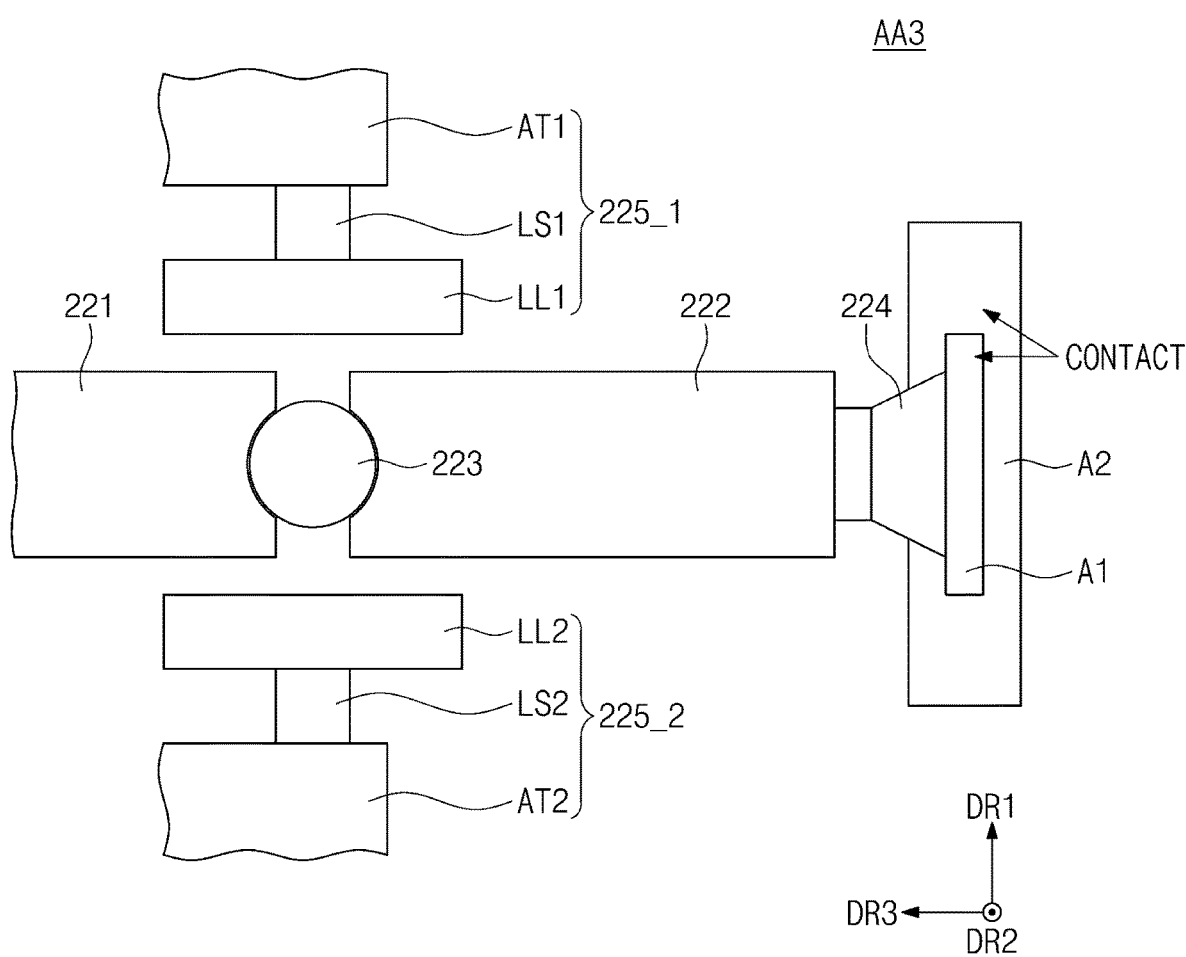
FIGS. 4A and 4B are illustrative cross-sectional views of region AA of FIG. 2 in a fastening mode.
Figure 4B:
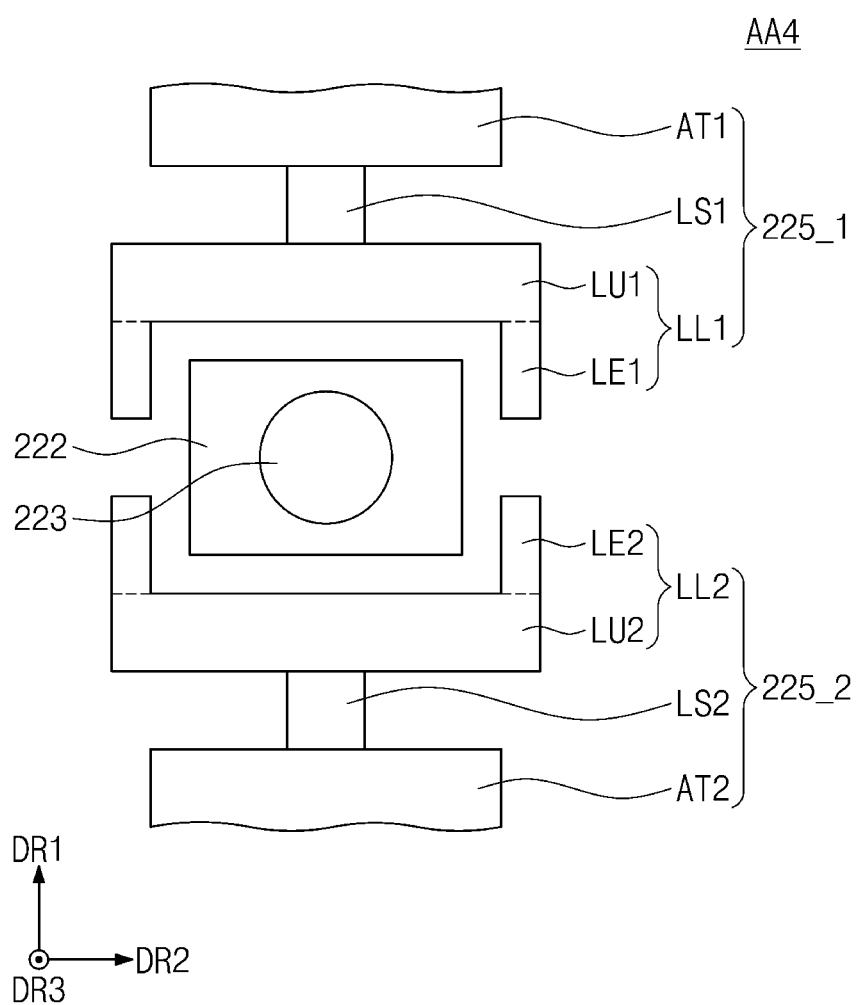

FIGS. 4A and 4B are illustrative cross-sectional views of a region AA of FIG. 2 in a fastening mode. FIG. 4A is a cross-sectional view of the region AA when viewed in the second direction DR2 with respect to a plane defined by the first direction DR1 and the third direction DR3. FIG. 4B is a cross-sectional view of the region AA when viewed in the third direction DR3 with respect to a plane defined by the first direction DR1 and the second direction DR2. For convenience of description, FIG. 4A defines a third region AA3, and FIG. 4B defines a fourth region AA4.

Referring to the third and fourth regions AA3 and AA4, in the fastening mode, the first lock part 225_1 and the second lock part 225_2 are spaced apart from the first and second links 221 and 222. The first electronic component A1 may contact the second electronic component A2. Because the first electronic component A1 may move at the joint 223, the first electronic component has a degree of freedom so that it may be flexibly inserted into the second electronic component A2.

Figure 5:
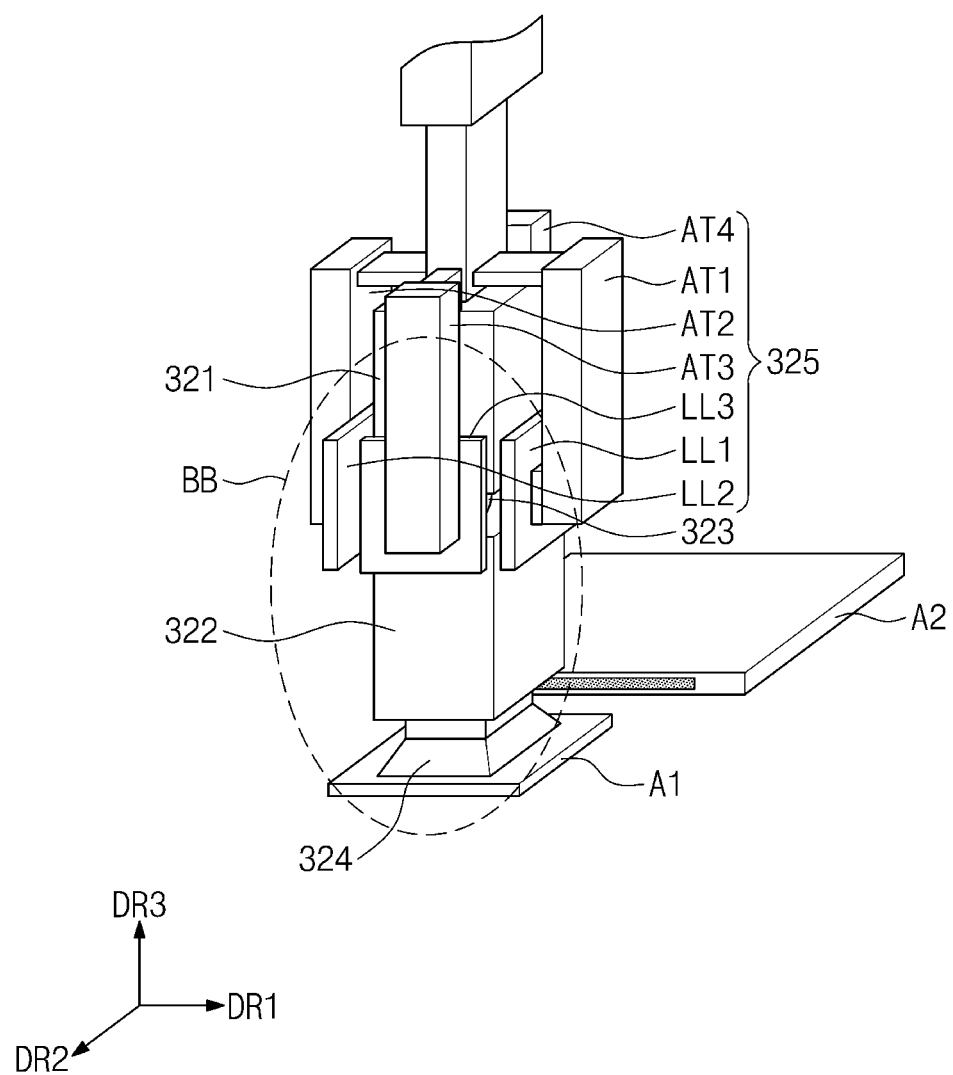
FIG. 5 is an illustrative perspective view of a fastening part (or a fastener) according to an embodiment of the present invention.

FIG. 5 is an illustrative perspective view of a fastening part 320 according to an embodiment of the present invention. Referring to FIG. 5, the fastening part 320 may include a first link 321, a second link 322, a joint 323, a head part 324, and a lock part 325.

Unlike FIG. 2, the lock part 325 may include not only first and second fixing parts LL1 and LL2 adjacent to each other in the first direction DR1, and first and second actuators AT1 and AT2, but also third and fourth fixing parts LL3 and LL4 adjacent to each other in the second direction DR2 and third and fourth actuators AT3 and AT4. (The fourth fixing part LL4 at the back of the arm is not shown in FIG. 5. See, e.g., FIG. 6A.)

In the movement mode, the first and second links 321 and 322 are fixed at four surfaces by the lock part 325. Accordingly, compared to the fastening part 220 of FIG. 2, the position of a first electronic component A1 may be more accurately controlled. As an illustrative example, the first electronic component A1 may be a stiff printed circuit board. However, embodiments of the present invention is not limited thereto, and the first electronic component A1 may be a circuit board having a smaller thickness.

Figure 6A:
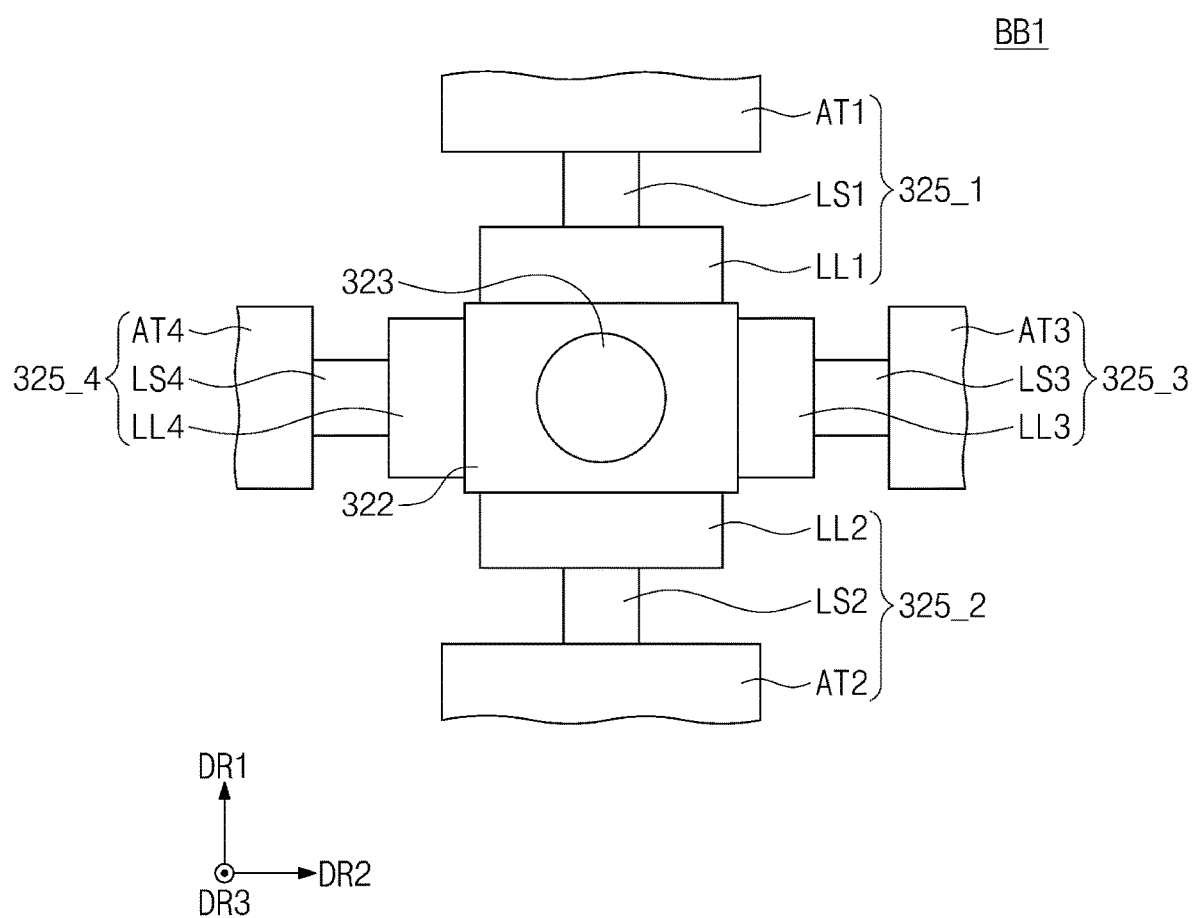
FIGS. 6A and 6B are illustrative cross-sectional views of region BB of FIG. 5.
Figure 6B:
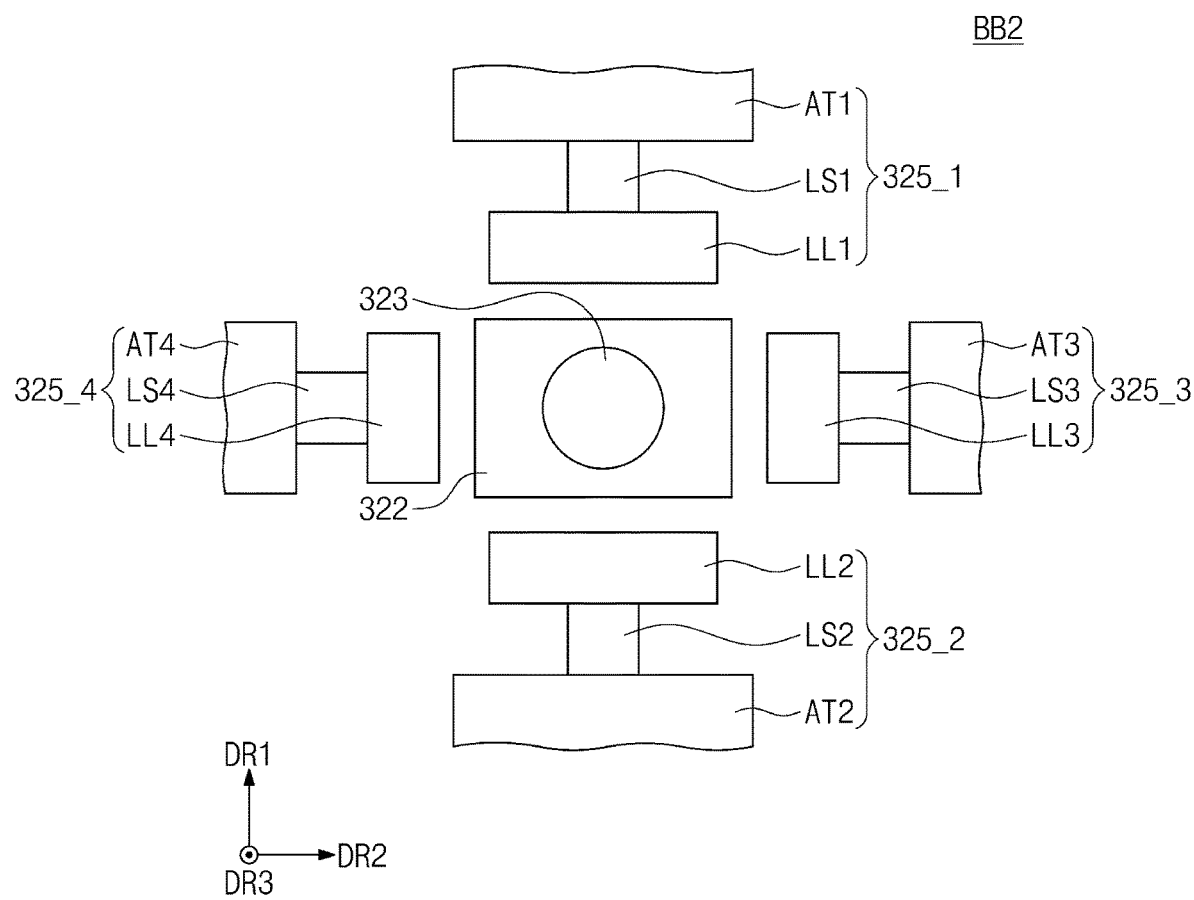

FIGS. 6A and 6B are illustrative cross-sectional views of a region BB of FIG. 5. FIGS. 6A and 6B are cross-sectional views of the region BB when viewed in the third direction DR3 with respect to a plane defined by the first direction DR1 and the second direction DR2. FIG. 6A is a cross-sectional view of the region BB in the movement mode, and for convenience of description, FIG. 6A defines a first region BB1. FIG. 6B is a cross-sectional view of the region BB in the fastening mode, and for convenience of description, FIG. 6B defines a second region BB2.

Referring to the first region BB1, the first region BB1 of a fastening part 320 include first to fourth lock parts 325_1 to 325_4. The first to fourth lock parts 325_1 to 325_4 each include a respective one of actuators AT1 to AT4, fixing parts LL1 to LL4, and support parts LS1 to LS4. In the movement mode, the first and second lock parts 325_1 and 325_2 respectively fix first and second links 321 and 322 in the first direction DR1, and the third and fourth lock parts 325_3 and 325_4 respectively fix first and second links 321 and 322 in the second direction DR2. Accordingly, the movements of an arm in the first direction DR1 and the second direction DR2 may be suppressed, and the position of a first electronic component A1 may accurately be controlled.

Referring to the second region BB2, in the fastening mode, the first to fourth lock parts 325_1 to 325_4 are respectively spaced apart from the first and second links 321 and 322. Accordingly, the movement of an arm is possible, and the first electronic component A1 has a degree of freedom and may be flexibly inserted into the second electronic component A2.

Figure 7:
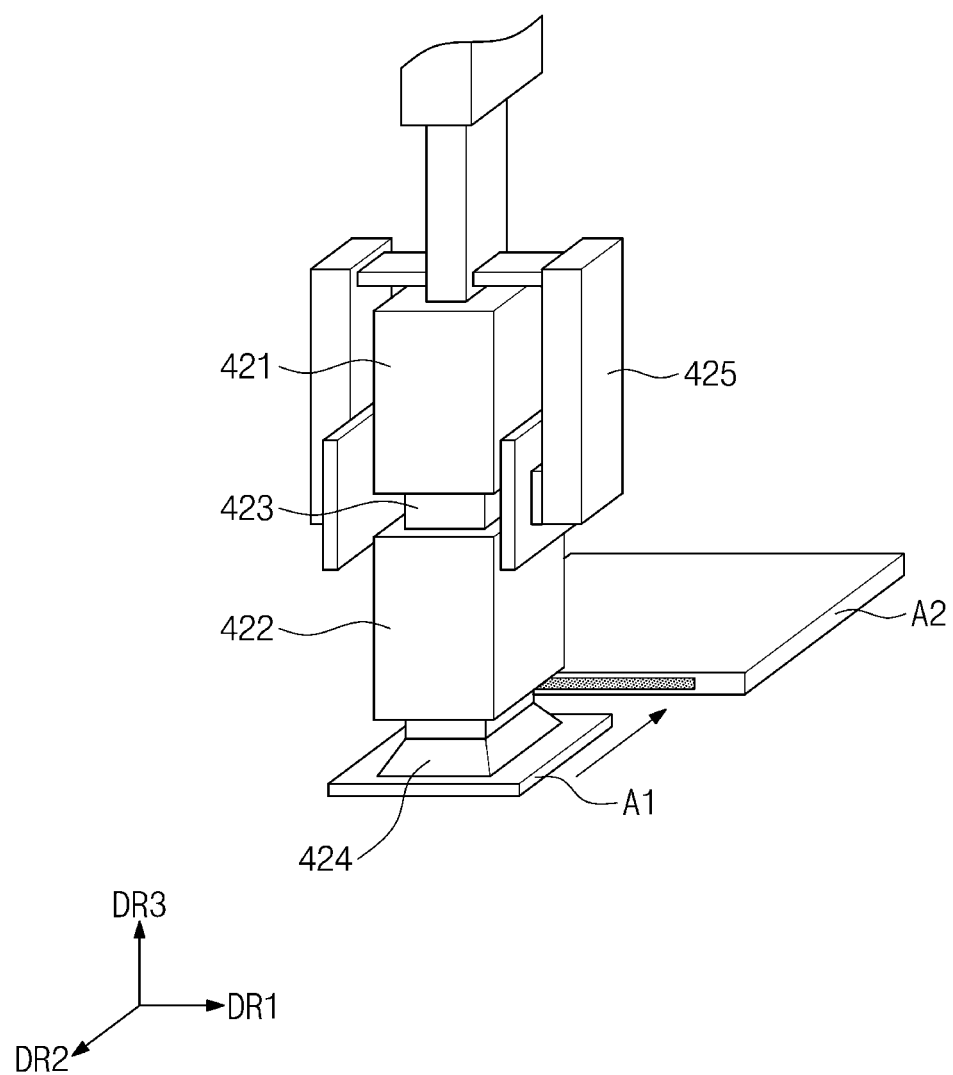
FIG. 7 is an illustrative perspective view of a fastening part (or a fastener) according to an embodiment of the present invention.

FIG. 7 is an illustrative perspective view of a fastening part 420 according to an embodiment of the present invention. Referring to FIG. 7, the fastening part 420 may include a first link 421, a second link 422, a flexible member 423, a head part 424, and a lock part 425. The first link 421, the second link 422, and the flexible member 423 form an arm.

Unlike FIGS. 1 to 6, the fastening part 420 may include the flexible member 423 in place of a joint. The flexible member 423 may include a material which may be deformed by external force such as gravitational force and be recovered again. For example, the flexible member 423 may include rubber, spring, a material in which a liquid is sealed, or the like. As described above in detail, the lock part 425 may fix the first and second links 421 and 422 in the movement mode, and may be spaced apart from the first and second links 421 and 422 in the fastening mode.

Figure 8:
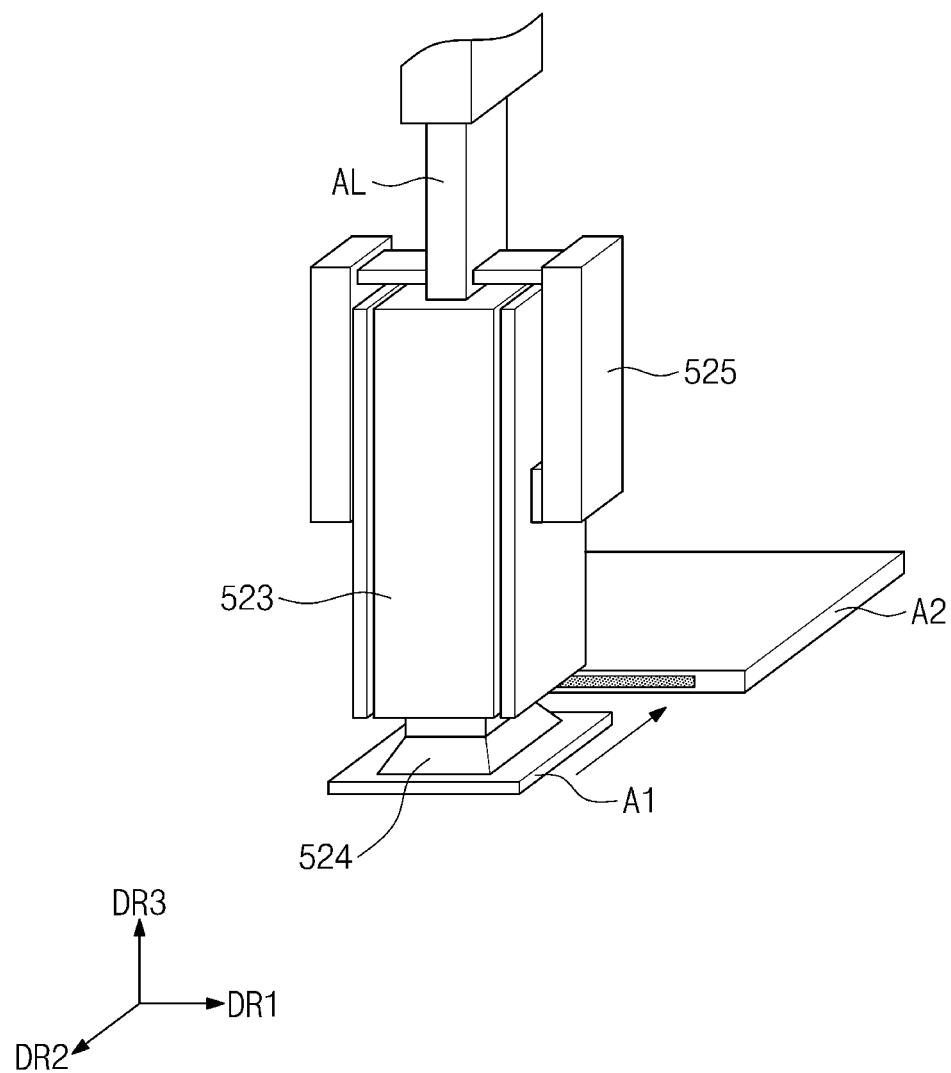
FIG. 8 is an illustrative perspective view of a fastening part (or a fastener) according to an embodiment of the present invention.

FIG. 8 is an illustrative perspective view of a fastening part 520 according to an embodiment of the present invention. Referring to FIG. 8, the fastening part 520 includes an elastic body 523, a head part 524, and a lock part 525. The elastic body 523 forms an arm.

Unlike FIGS. 1 to 7, the fastening part 520 is not provided with separate links, but may form an arm by using the one elastic body 523. For example, the elastic body 523 may include an elastic material such as rubber. For example, the elastic body 523 may include a material such as the flexible member 423 of FIG. 7. In the movement mode, the lock part 525 may fix the elastic body 523, and in the fastening mode, the lock part 525 may be spaced apart from the elastic body 523. In order to increase the force restraining the elastic body 523, the contact surface between the lock part 525 and the elastic body 523 may be wider than the contact surfaces illustrated in FIGS. 1 to 7.

Figure 9:
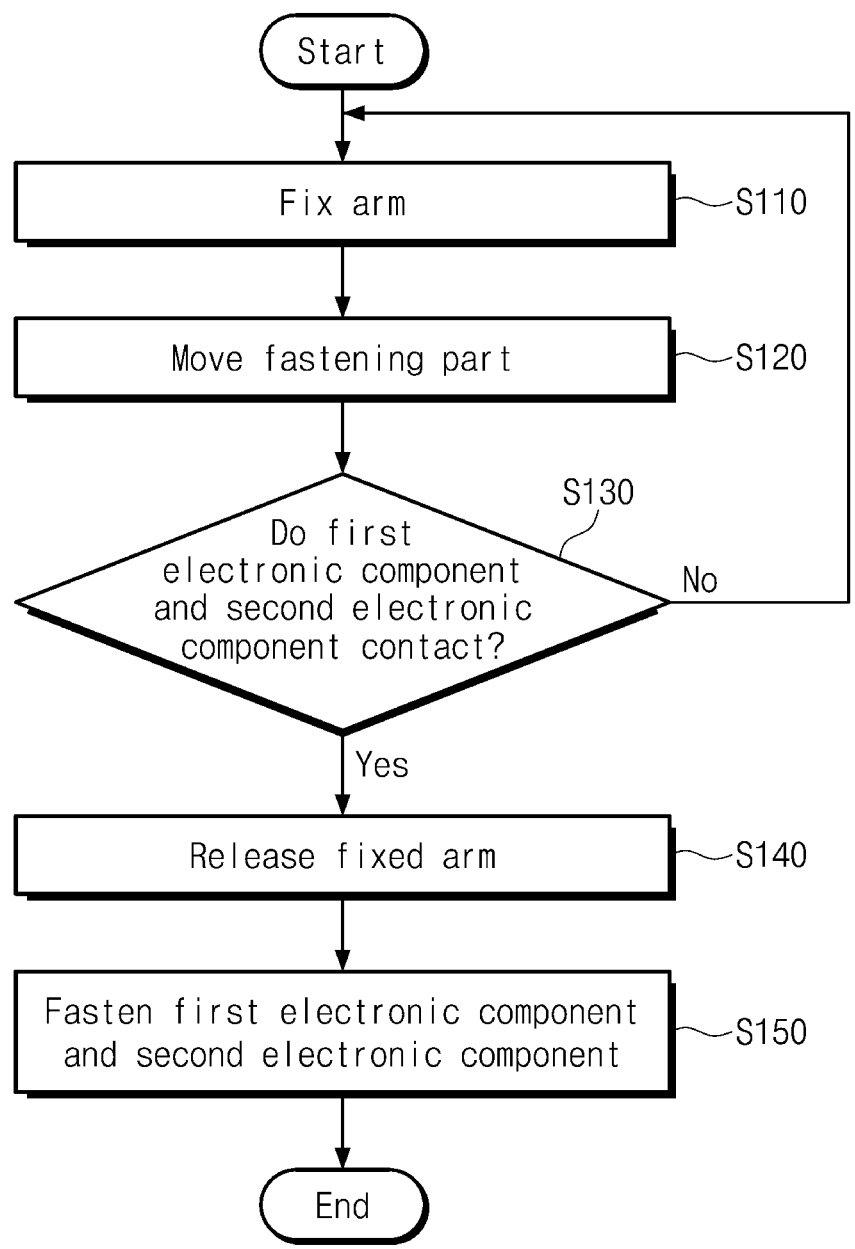
FIG. 9 is an illustrative flowchart of a method for fastening a component using a robot arm apparatus (or a robot arm) according to an embodiment of the present invention.

FIG. 9 is an illustrative flowchart of a method for fastening a component using a robot arm apparatus according to an embodiment of the present invention. The steps of FIG. 9 may be performed by any of the robot arm apparatuses described in FIGS. 1 to 8. For convenience of description, FIG. 9 is described using the reference symbols of FIG. 1.

In step S110, a robot arm apparatus 100 operates in the movement mode, and the arm is fixed. As described above, the arm may include the first link 121, the second link 122, and the joint 123 of FIG. 1, it may include the first link 421, the second link 422, and the flexible member 423 of FIG. 7, or it may include the elastic body 523 of FIG. 8. The arm may be fixed by coming into contact with the lock part 125. A movement of the electronic component A1 may be restrained by fixing the arm.

In step S120, the fastening part 120 of the robot arm apparatus 100 moves to a specified coordinate by the movable part 110. The specified coordinate may be a space for fastening the first electronic component A1 and the second electronic component A2. Such a space may be a reference space, and the reference space may include a space in which at least a portion of a fastening region of the first electronic component A1 contacts at least a portion of the fastening region of the second electronic component A2. Step S120 is performed in the movement mode.

In step S130, the contact between the first electronic component A1 and the second electronic component A2 are determined. Such a contact may be detected through a separate position detection sensor. When the fastening region of the first electronic component A1 and the fastening region of the second electronic component A2 do not contact each other, that is, when the first electronic component A1 does not reach the reference space, step S110 is performed. That is the movement mode is maintained. When the fastening region of the first electronic component A1 and the fastening region of the second electronic component A2 contact each other, that is, when the first electronic component A1 reaches the reference space, step S140 is performed.

In step S140, the robot arm apparatus 100 operates in the fastening mode, and the fixed arm is released. The arm may be spaced apart from the lock part 125. Because the fixed arm is released, it is possible to move the arm at the joint 123.

In step S150, the first electronic component A1 and the second electronic component A2 are fastened. The first electronic component A1 has a degree of freedom due to the movement of the arm and may be flexibly inserted into the second electronic component A2.

Figure 10:
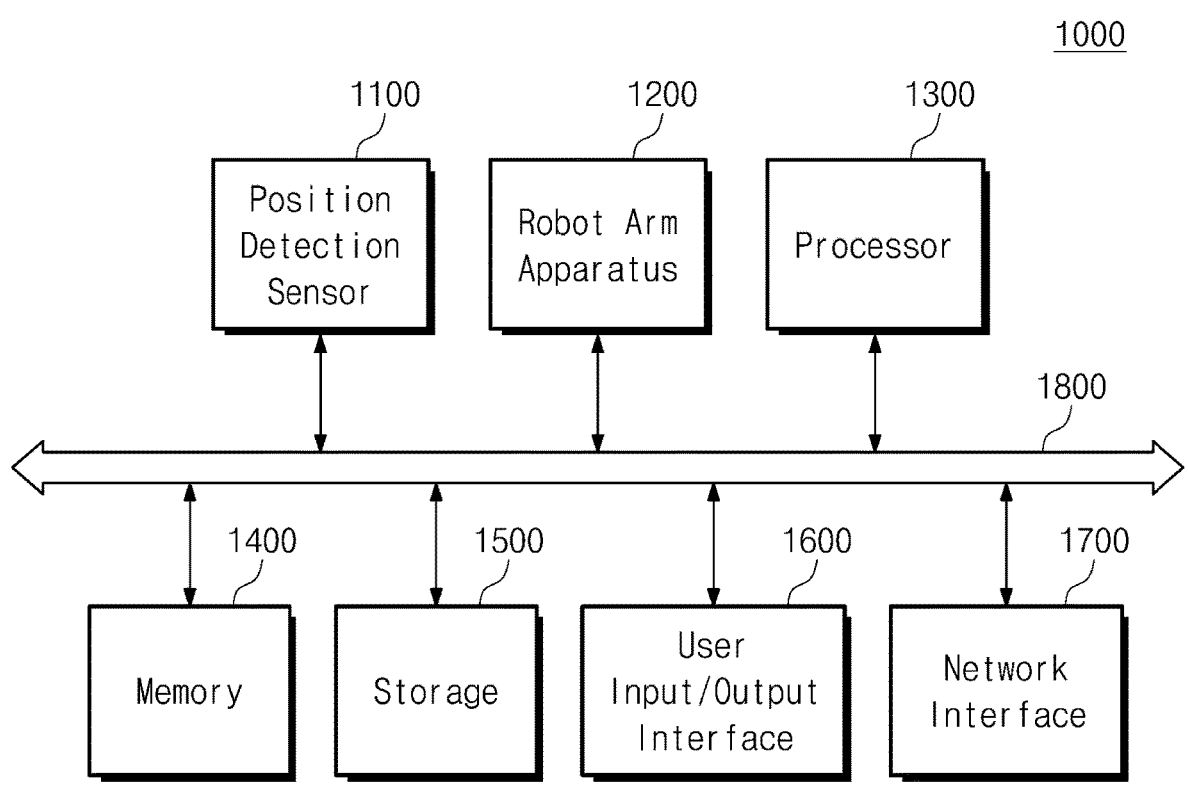
FIG. 10 is an illustrative block diagram of a component fastening system including a robot arm apparatus according to an embodiment of the present invention.

FIG. 10 is an illustrative block diagram of a component fastening system 1000 including a robot arm apparatus according to an embodiment of the present invention. The component fastening system 1000 will be understood as an illustrative configuration which controls a robot arm apparatus to fasten the first electronic component A1 and the second electronic component A2 to each other. Accordingly, embodiments of the component fastening system 1000 are not limited thereto. Referring to FIG. 10, the component fastening system 1000 may include a position detection sensor 1100, a robot arm apparatus 1200, a processor 1300, a memory 1400, a storage 1500, a user input/output interface 1600, a network interface 1700 and a bus 1800.

The position detection sensor 1100 may detect the position of the first electronic component A1. The position detection sensor 1100 may be attached to the robot arm apparatus 1200 or be spaced apart from the robot arm apparatus 1200. The position detection sensor 1100 may detect the position of the first electronic component A1 present in a reference space. For example, the position detection sensor 1100 may detect a contact between the first electronic component A1 and the second electronic component A2. The position detection sensor 1100 may detect the position of the first electronic component A1 instead of the position of the robot arm apparatus 1200 in order to improve the accuracy of the fastening.

The position detection sensor 1100 may detect the position through various methods. For example, the position detection sensor 1100 may include a radar detection sensor, an ultrasonic detection sensor, an infrared sensor, a camera sensor, and/or the like. However, embodiments of the present invention are not limited thereto, and the position detection sensor 1100 may include a magnetic detection sensor, an inductive detection sensor, or a capacitive detection sensor.

The robot arm apparatus 1200 carries the first electronic component A1 and performs the operation of fastening the first and second electronic components A1 and A2. The robot arm apparatus 1200 may be one of the robot arm apparatuses having various structures of a fastening part described in FIGS. 1 to 8. The robot arm apparatus 1200 may fix an arm or release the arm on the basis of the position of the first electronic component A1, as detected by the position detection sensor 1100. To this end, the robot arm apparatus 1200 may include a lock part, such as the lock parts described in FIGS. 1 to 8.

The processor 1300 may function as a central processing device of the component fastening system 1000. The processor 1300 may perform control operations and calculation operations which are used for the position detection of the position detection sensor 1100, for the movements of the robot arm apparatus 1200, for the determination of an operation mode, for operation of the lock part, and for the fastening operation for the first and second electronic components A1 and A2. The processor 1300 may operate using a calculation space in the memory 1400, and may read, from the storage 1500, files for operating an operating system and execution files for applications.

For example, according to a control operation of the processor 1300, the position detection sensor 1100 may detect the position of the electronic component A1 at a specific time, and generate positional information. According to a control operation of the processor 1300, a contact between the first electronic component A1 and the second electronic component A2 is detected, and the operation mode may be changed from the movement mode to the fastening mode. According to a control operation of the processor 1300, a signal for operating the lock part may be generated corresponding to the operation mode. For example, in the movement mode, according to the control operation of the processor 1300, an enable signal is generated and transmitted to actuators so that the lock part comes into contact with an arm. In the fastening mode, according to the control operation of the processor 1300, a disable signal is generated and transmitted to the actuators so that the lock part is spaced apart from the arm.

The memory 1400 may store data and processor codes which have been processed or are to be processed by the processor 1300. For example, the memory 1400 may store positional information provided from the position detection sensor 1100, information for determining the operation mode, or information for generating the enable signal or the disable signal. The memory 1400 may be used as a main storage device of the component fastening system 1000.

The storage 1500 may store data which is generated by the operating system or applications for long-term storage, files for driving the operating system, execution files for applications, and the like. For example, the storage 1500 may store files for executing a control program for the position detection sensor 1100 or the robot arm apparatus 1200. These files may be loaded on the memory 1400 during execution thereof. However, embodiments of the present invention are not limited thereto, and the position detection sensor 1100 or the robot arm apparatus 1200 may be controlled by a dedicated logic circuit or the like, such as an field programmable gate array (FPGA) or an application specific integrated circuit (ASIC). The storage 1500 may be used as an auxiliary storage device of the component fastening system 1000.

The user input/output interface 1600 may exchange information with a user. The user input/output interface 1600 may include a user input interface for receiving information from a user, such as a keyboard, a mouse, a touch panel, or a microphone, and a user output interface, for providing information to the user, such as a monitor, a speaker, or a motor.

The network interface 1700 may be configured to communicate with external electronic apparatuses. As an illustrative example, the network interface 1700 may perform communication via at least one of various wireless communication methods, such as long term evolution (LTE), code division multiple access (CDMA), WiFi, or radio frequency identification (RFID), via at least of various wired communication methods, such as a universal serial bus (USB) or a serial AT attachment (SATA) or any other suitable wireless or wired communication methods known to those skilled in the art.

The bus 1800 may provide communication paths between the components of the component fastening system 1000. The position detection sensor 1100, the robot arm apparatus 1200, the processor 1300, the memory 1400, the storage 1500, the user input/output interface 1600, and the network interface 1700 may exchange data with each other through the bus 1800. The bus 1800 may be configured to support various types of communication formats used in the component fastening system 1000.

Figure 11:
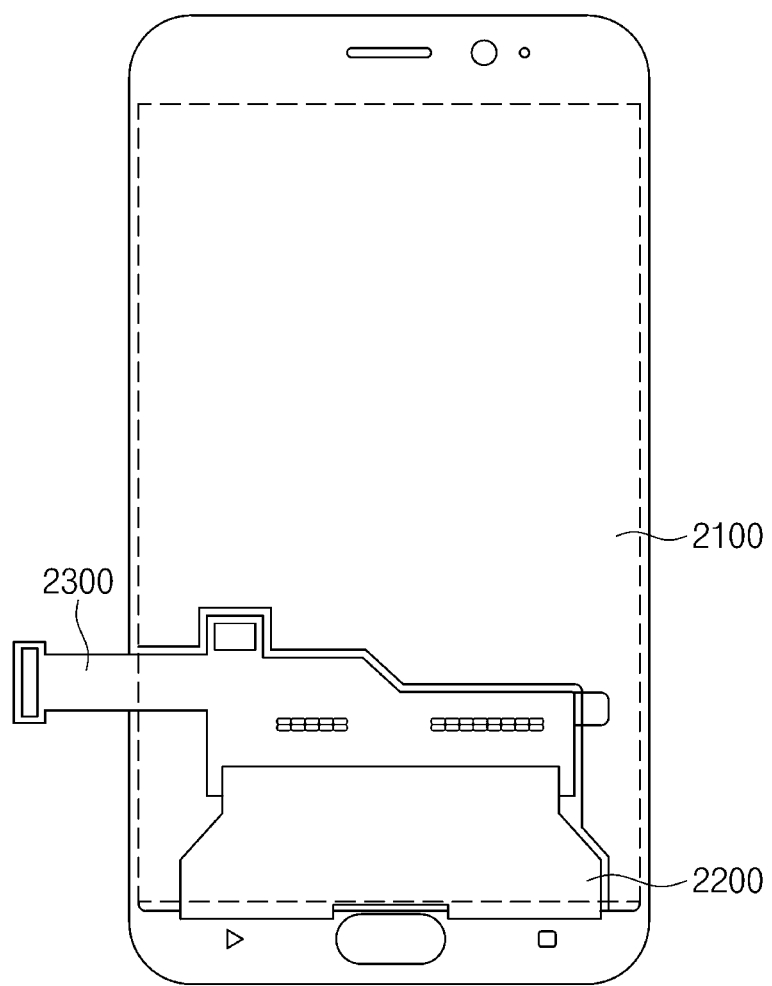
FIG. 11 is an illustrative view of a display device including an electronic component according to an embodiment of the present invention.

FIG. 11 is an illustrative view of a display device 2000 including an electronic component according to an embodiment of the present invention. Referring to FIG. 11, the display device 2000 may include a display panel 2100, a first circuit board 2200 and a second circuit board 2300. The second circuit board 2300 may correspond to the first electronic component A1 described above.

The display panel 2100 is configured to display an image and may be at least one of a liquid crystal panel, an organic light emitting display panel, a plasma display panel, an electrophoretic display panel, or an electrowetting display panel.

The first circuit board 2200 is connected, through the second circuit board 2300, to an external system, a system power supply part, a main board, and/or the like. The first circuit board 2200 is fixed to the display panel 2100 in a bent shape by utilizing a component for electrically connecting the second circuit board 2300 disposed on the rear surface of the display panel 2100. A control signal, power, and the like may be supplied through the second circuit board 2300 and the first circuit board 2200.

In the component fastening method described with reference to FIG. 9, the head part 124 shown in FIG. 1 may apply suction to the second circuit board 2300 and insert the second circuit board into a second electronic component. The second electronic component may be a socket-type connector connected to the main board or the like.

According to above-mentioned description, an arm is fixed until an electronic component is fastened, so that the electronic component may accurately be moved to a specific position. In addition, the fixed arm is released while the electronic component is fastened, so that the damage to the electronic component may be reduced, and a flexible fastening operation may be performed.

It will be apparent to those skilled in the art that various modifications and variations can be made in the present invention. Thus, it is intended that the present invention covers the modifications and variations of this invention provided that they come within the scope of the appended claims and their respective equivalents.

Hence, the real protective scope of the present invention shall be determined by the accompanying claims and their equivalents.

What is claimed is:

1. A robot arm apparatus comprising:
   a fastener configured to fasten a first electronic component to a second electronic component; and
   a movable part configured to move the fastener,
   wherein the fastener comprises:
      an arm connected to the movable part;
      a head connected to the arm and configured to contact the first electronic component; and
      a lock part for locking the arm to prevent the arm from moving at a joint of the arm when the first electronic component is moved to a reference space, and to be spaced apart from the arm when the first electronic component is fastened to the second electronic component after the first electronic component is moved to the reference space.

2. The robot arm apparatus of claim 1, wherein the arm comprises:
   a first link connected to the movable part;
   the joint connected to the first link and configured to be rotatable; and
   a second link connected to the joint and located between the joint and the head.

3. The robot arm apparatus of claim 2, wherein, when the first electronic component is moved to the reference space, the lock part contacts the first link and the second link so that the arm is fixed, and when the first electronic component is fastened to the second electronic component, the lock part is spaced apart from the first link and the second link.

4. The robot arm apparatus of claim 1, wherein the lock part comprises:
   a fixing part having a contact surface configured to contact the arm when the first electronic component is moved to the reference space; and
   an actuator configured to move the fixing part so that the fixing part contacts the arm when the first electronic component is moved to the reference space, and configured to move the fixing part so that the fixing part is spaced apart from the arm when the first electronic component is fastened to the second electronic component.

5. The robot arm apparatus of claim 1, wherein the lock part comprises:
   a first fixing part configured to contact a first surface of the arm when the first electronic component is moved to the reference space; and
   a second fixing part configured to contact a second surface of the arm when the first electronic component is moved to the reference space, the second surface facing the first surface.

6. The robot arm apparatus of claim 5, wherein a direction in which the first electronic component is fastened to the second electronic component is perpendicular to a direction in which the first and second fixing parts contact the arm when the first electronic component is moved to the reference space.

7. The robot arm apparatus of claim 5, wherein the lock part further comprises:
   a third fixing part configured to contact a third surface of the arm when the first electronic component is moved to the reference space; and
   a fourth fixing part configured to contact a fourth surface of the arm when the first electronic component is moved to the reference space, wherein
   the first surface and the second surface face each other in a first direction, and
   the third surface and the fourth surface face each other in a second direction crossing the first direction.

8. The robot arm apparatus of claim 1, wherein the arm comprises:
   a first link connected to the movable part;
   a flexible member connected to the first link; and
   a second link connected to the flexible member and located between the flexible member and the head, wherein, when the first electronic component is moved to the reference space, the lock part contacts the first link and the second link so that the arm is fixed, and, when the first electronic component is fastened to the second electronic component, the lock part is spaced apart from the first link and the second link.

9. The robot arm apparatus of claim 1, wherein the arm comprises an elastic body.

10. The robot arm apparatus of claim 1, wherein the reference space comprises a space in which at least a portion of a first fastening region of the first electronic component contacts at least a portion of a second fastening region of the second electronic component.

* * * * *